United States Patent
Karamcheti et al.

(10) Patent No.: US 9,842,660 B1
(45) Date of Patent: Dec. 12, 2017

(54) SYSTEM AND METHOD TO IMPROVE ENTERPRISE RELIABILITY THROUGH TRACKING I/O PERFORMANCE METRICS IN NON-VOLATILE RANDOM ACCESS MEMORY

(71) Applicant: Virident Systems Inc., Milpitas, CA (US)

(72) Inventors: Vijay Karamcheti, Palo Alto, CA (US); Ashish Singhai, Cupertino, CA (US); Ashwin Narasimha, Sunnyvale, CA (US); Muthugopalkrishnan Adiseshan, Bangalore (IN); Viswesh Sankaran, Bangalore (IN); Ajith Kumar, Dodda Kammanahalli (IN)

(73) Assignee: VIRIDENT SYSTEMS, LLC, San Jose, CA (US)

( * ) Notice: Subject to any disclaimer, the term of this patent is extended or adjusted under 35 U.S.C. 154(b) by 46 days.

(21) Appl. No.: 13/841,026

(22) Filed: Mar. 15, 2013

Related U.S. Application Data

(60) Provisional application No. 61/746,694, filed on Dec. 28, 2012.

(51) Int. Cl.
*G06F 11/00* (2006.01)
*G11C 29/04* (2006.01)
(Continued)

(52) U.S. Cl.
CPC .............. *G11C 29/04* (2013.01); *G06F 11/34* (2013.01); *G06F 11/0757* (2013.01); *G06F 11/3034* (2013.01); *G06F 11/3409* (2013.01)

(58) Field of Classification Search
CPC ............ G06F 11/3409; G06F 11/0754; G06F 11/0757; G06F 11/3034; G06F 11/3041; G11C 29/04
(Continued)

(56) References Cited

U.S. PATENT DOCUMENTS 3,363,240 A    1/1968   Cola et al.
5,276,835 A    1/1994   Mohan et al.
(Continued)

FOREIGN PATENT DOCUMENTS

WO    WO 2012/096652       7/2012
WO    WO-2012/100087 A2    7/2012

OTHER PUBLICATIONS

"Grubb's test for outliers". Wikipedia: The Free Encyclopedia. Wikimedia Foundation, Inc. Feb. 5, 2013. Web Oct. 30, 2014 <http://en.Wikipedia.org/w/index.php?title=Grubbs%27_test_for_outliers&oldid=536740235>).*
(Continued)

*Primary Examiner* — Michael Maskulinski
(74) *Attorney, Agent, or Firm* — Patterson & Sheridan, LLP

(57) ABSTRACT

A method for managing a non-volatile random-access memory (NVRAM)-based storage subsystem, the method including: monitoring, by a slave controller on a NVRAM device of the NVRAM-based storage subsystem, an I/O operation on the NVRAM device; identifying, by the slave controller and based on the monitoring, at least one occurrence of error data; comparing, by the slave controller, a numeric aspect of the at least one occurrence of error data with a threshold setting; reporting, by the slave controller on the NVRAM device and to a master controller of the NVRAM-based storage subsystem, the at least one occurrence of error data in response to the numeric aspect crossing the threshold setting; and ascertaining, by the master controller of the NVRAM-based storage system, a physical location of a defect region on the NVRAM device where the error data has occurred by analyzing the reported at least one occurrence of error data.

30 Claims, 5 Drawing Sheets

(51) Int. Cl.
G06F 11/30 (2006.01)
G06F 11/34 (2006.01)
G06F 11/07 (2006.01)

(58) Field of Classification Search
USPC .................. 714/6.13, 723, 42, 52; 709/208
See application file for complete search history.

(56) References Cited

U.S. PATENT DOCUMENTS

| | | | |
|---|---|---|---|
| 5,734,861 | A | 3/1998 | Cohn et al. |
| 5,787,466 | A | 7/1998 | Berliner |
| 6,018,779 | A | 1/2000 | Blumenau et al. |
| 6,895,490 | B1 | 5/2005 | Moore et al. |
| 7,370,143 | B1 | 5/2008 | Scott |
| 7,613,870 | B2 | 11/2009 | Bartley et al. |
| 7,930,513 | B2 | 4/2011 | Karamcheti |
| 7,971,093 | B1 * | 6/2011 | Goel ................ G06F 11/004 714/6.22 |
| 8,055,873 | B2 | 11/2011 | Chu et al. |
| 8,156,299 | B2 | 4/2012 | Okin et al. |
| 8,239,617 | B1 | 8/2012 | Linnell |
| 8,352,673 | B2 | 1/2013 | Chu |
| 8,452,929 | B2 | 5/2013 | Bennett |
| 8,621,145 | B1 | 12/2013 | Kimmel et al. |
| 8,626,987 | B2 | 1/2014 | Jung et al. |
| 8,688,896 | B2 | 4/2014 | Nakamura et al. |
| 8,719,488 | B2 | 5/2014 | Maheshwari |
| 8,756,375 | B2 | 6/2014 | Flynn |
| 9,122,588 | B1 | 9/2015 | Mondal |
| 2004/0094778 | A1 | 5/2004 | Ooishi |
| 2005/0022051 | A1 | 1/2005 | Zane et al. |
| 2005/0041449 | A1 | 2/2005 | Houston |
| 2005/0289197 | A1 | 12/2005 | Kan |
| 2006/0075156 | A1 * | 4/2006 | Okaki ................ G06F 11/201 710/17 |
| 2006/0155917 | A1 | 7/2006 | Di Sena et al. |
| 2006/0274566 | A1 | 12/2006 | Takashima et al. |
| 2007/0294490 | A1 | 12/2007 | Freitas |
| 2009/0019218 | A1 | 1/2009 | Sinclair et al. |
| 2009/0157989 | A1 | 6/2009 | Karamcheti et al. |
| 2009/0172263 | A1 | 7/2009 | Olbrich et al. |
| 2009/0198874 | A1 | 8/2009 | Tzeng |
| 2009/0313417 | A1 | 12/2009 | Wan |
| 2010/0070729 | A1 | 3/2010 | Ng et al. |
| 2010/0262773 | A1 | 10/2010 | Borchers et al. |
| 2011/0167192 | A1 | 7/2011 | Lyer et al. |
| 2011/0239064 | A1 * | 9/2011 | Byom ................ G06F 11/1048 714/723 |
| 2012/0079353 | A1 * | 3/2012 | Liikanen ............ G06F 11/1048 714/773 |
| 2012/0198138 | A1 | 8/2012 | Okin et al. |
| 2012/0217549 | A1 | 8/2012 | Widjaja |
| 2013/0019057 | A1 | 1/2013 | Stephens |
| 2013/0054853 | A1 | 2/2013 | Wang et al. |
| 2013/0054873 | A1 | 2/2013 | Belluomini |
| 2013/0297852 | A1 | 11/2013 | Fai et al. |
| 2013/0297880 | A1 | 11/2013 | Flynn |
| 2014/0068182 | A1 | 3/2014 | Terry |
| 2014/0181364 | A1 | 6/2014 | Berke |
| 2014/0281121 | A1 | 9/2014 | Karamcheti et al. |
| 2014/0281133 | A1 | 9/2014 | Karamcheti et al. |
| 2014/0281138 | A1 | 9/2014 | Karamcheti et al. |
| 2014/0281152 | A1 | 9/2014 | Karamcheti et al. |
| 2015/0193144 | A1 | 7/2015 | Bilas |
| 2015/0331806 | A1 | 11/2015 | Mondal et al. |
| 2016/0004612 | A1 | 1/2016 | Karamcheti et al. |
| 2016/0004635 | A1 | 1/2016 | Karamcheti et al. |

OTHER PUBLICATIONS

Grubbs' test for outliers. (May 14, 2016). In Wikipedia, The Free Encyclopedia. Retrieved 22:44, May 25, 2016, from https://en.wikipedia.org/w/index.php?title=Grubbs%27_test_for_outliers&oldid=536740235.*

Cassuto et al., "Codes for asymmetric limited-magnitude errors with application to multi-level flash memories," Retrieved Feb. 3, 2017, from http://www.paradise.caltech.edu/papers/etr088.pdf, 15 pages.

Extended European Search Report for Application No. 14763754.0, dated Janury 4, 2017, 7 pages.

International Search Report and Written Opinion in International Application No. PCT/US2014/026773, dated Aug. 11, 2014, 7 pages.

International Search Report and Written Opinion in International Application No. PCT/US2014/029053, dated Aug. 27, 2014, 11 pages.

U.S. Final Office Action for U.S. Appl. No. 13/838,699, dated Oct. 8, 2015, 25 pages.

U.S. Final Office Action for U.S. Appl. No. 13/927,740, dated Aug. 28, 2015, 44 pages.

U.S. Final Office Action for U.S. Appl. No. 14/852,844, dated Feb. 16, 2016, 12 pages.

U.S. Non-Final Office Action for U.S. Appl. No. 13/838,699, dated Apr. 7, 2015, 19 pages.

U.S. Non-Final Office Action for U.S. Appl. No. 13/841,706 dated Apr. 24, 2015, 10 pages.

U.S. Non-Final Office Action for U.S. Appl. No. 13/843,714, dated Dec. 5, 2014, 16 pages.

U.S. Non-Final Office Action for U.S. Appl. No. 13/927,740, dated Feb. 12, 2015, 34 pages.

U.S. Non-Final Office Action for U.S. Appl. No. 13/927,871, dated Feb. 13, 2015, 39 pages.

U.S. Non-Final Office Action for U.S. Appl. No. 14/852,844, dated Oct. 27, 2015, 14 pages.

U.S. Notice of Allowance for U.S. Appl. No. 13/841,706 dated Nov. 3, 2015, 7 pages.

U.S. Notice of Allowance for U.S. Appl. No. 13/842,940 dated Nov. 21, 2014, 9 pages.

U.S. Notice of Allowance for U.S. Appl. No. 13/843,511 dated Dec. 16, 2014, 9 pages.

U.S. Notice of Allowance for U.S. Appl. No. 13/843,714, dated Apr. 27, 2015, 10 pages.

U.S. Notice of Allowance for U.S. Appl. No. 13/927,740, dated Dec. 18, 2015, 10 pages.

U.S. Notice of Allowance for U.S. Appl. No. 13/927,871, dated Sep. 15, 2015, 14 pages.

U.S. Notice of Allowance for U.S. Appl. No. 14/667,804 dated Nov. 27, 2015, 13 pages.

U.S. Notice of Allowance for U.S. Appl. No. 14/852,844, dated Jun. 22, 2016, 8 pages.

* cited by examiner

FIG. 1A

SYSTEM AND METHOD TO IMPROVE ENTERPRISE RELIABILITY THROUGH TRACKING I/O PERFORMANCE METRICS IN NON-VOLATILE RANDOM ACCESS MEMORY

CROSS REFERENCE TO RELATED APPLICATION

This patent application claims the benefit of priority under 35 USC 119(e) of U.S. Provisional Patent Application Ser. No. 61/746,694, filed Dec. 28, 2012, the entire contents of which are incorporated herein by reference.

BACKGROUND

Computer systems typically use memory modules for storing data. Some of the memory modules are realized by memory cards that include non-volatile computer memory, such as flash memory. Examples of nonvolatile memory may include NOR flash, NAND flash, and Phase Change Memory.

SUMMARY

In one aspect, a method manages a non-volatile random-access memory (NVRAM)-based storage subsystem. The method includes monitoring, by a slave controller on a NVRAM device of the NVRAM-based storage subsystem, an input/output (I/O) operation on the NVRAM device; identifying, by the slave controller on the NVRAM device and based on the monitoring, at least one occurrence of error data; comparing, by the slave controller on the NVRAM device, a numeric aspect of the at least one occurrence of error data with a threshold setting; reporting, by the slave controller on the NVRAM device and to a master controller of the NVRAM-based storage subsystem, the at least one occurrence of error data in response to the numeric aspect crossing the threshold setting; and ascertaining, by the master controller of the NVRAM-based storage system, a physical location of a defect region on the NVRAM device where the error data has occurred by analyzing the reported at least one occurrence of error data.

Implementations may include one or more of the following features. The method may additionally include: method of claim 1, further comprising: summarizing information encoding physical locations of defect region on the plurality of NVRAM devices; and storing the summarized information for persistent storage. The method may further include: further comprising: driving decisions managing subsequent I/O operations on the plurality of NVRAM devices in view of the summarized information stored.

The NVRAM device may include, a plurality of packages, wherein each package comprises a plurality of dice, wherein each die comprises a plurality of planes, wherein each plane comprises a plurality of erase blocks, and wherein each erase block comprises a plurality of write pages. Each of the flash planes may include at least one of: a Single-Level Cell (SLC) NAND flash, a Multi-Level Cell (MLC) NAND flash, or a Single-Level Cell (SLC) NOR flash.

The I/O operation on the NVRAM device may include one of: a read operation on the NVRAM device, a write operation on the NVRAM device, and an erase operation on the NVRAM device. The monitoring of such I/O operations may be more frequent during an earlier life-time phase of the NVRAM device than during a later life-time phase of the NVRAM device.

The numeric aspect of the error data may measure one of: a duration of the I/O operation on the NVRAM device, a number of occurrences of correctable errors associated with a plurality of the I/O operations on the NVRAM device, or an error rate associated with a plurality of the I/O operation on the NVRAM device, wherein the correctable error is curable by an error-checking mechanism. The at least one occurrence of error data may be caused by the duration of the I/O operation on the NVRAM device having exceeded a time-out value. The at least one occurrence of error data may be caused by the numeric aspect of the at least one occurrence of error data falling below the threshold setting. The at least one occurrence of error data may also be caused by the numeric aspect of the at least one occurrence of error data exceeding the threshold setting.

Comparing the numerical aspect may include determining whether the occurrence of the at least one error data qualifies as a statistical outlier. The statistical outlier may be outside a statistical mean plus a pre-determined number of standard deviations. The statistical outlier may be outside a statistical mean plus a pre-determined number of standard deviations.

The threshold setting may be adaptively configured. The defect region may correspond to one of: a degraded region, or an inoperative region.

In another aspect, a non-volatile random access memory (NVRAM)-based storage subsystem is mounted on a host computing device. The NVRAM-based storage subsystem includes: a master controller; a plurality of NVRAM devices, each comprising a plurality of packages, and a slave controller in communication with the master controller; wherein the slave controller is configured to: monitor an I/O operation on the NVRAM device; identify at least one occurrence of error data associated with the monitored I/O operation; compare a numeric aspect of the occurrence of the at least one error data with a threshold setting; and report the at least one occurrence of error data in response to the numeric aspect crossing the threshold setting; wherein the master controller is configured to ascertain a physical location of a defect on the NVRAM corresponding to the at least one error occurrence by analyzing the reported at least one error, wherein each package comprises a plurality of dice, and wherein each die comprises a plurality of planes.

Implementations may include one or more of the following features. Each of the plurality of flash planes may include at least one of: a Single-Level Cell (SLC) NAND flash, a Multi-Level Cell (MLC) NAND flash, a Single-Level Cell (SLC) NOR flash.

The I/O operation on the NVRAM device may include one of: a read operation on the NVRAM device, a write operation on the NVRAM device, and an erase operation on the NVRAM device. The I/O operations may be monitored more frequently during an earlier life-time phase of the NVRAM device than during a later life-time phase of the NVRAM device.

The numeric aspect may measure one of: a duration of the I/O operation on the NVRAM device, a number of occurrences of a correctable error associated with a plurality of the I/O operations on the NVRAM device, or an error rate associated with a plurality of the I/O operations on the NVRAM device, and wherein the correctable error is curable by an error-checking mechanism.

The at least one occurrence of error data may be caused by the duration of the underlying operation on the NVRAM device having exceeded a time-out value. The at least one occurrence of error data may also be caused by the numeric aspect of the at least one occurrence of error data falling below the threshold. The at least one occurrence of error data may additionally be caused by the numeric aspect of the at least one occurrence of error data exceeding the threshold.

Comparing the numerical aspect may include determining whether the occurrence of the at least one error data qualifies as a statistical outlier. The statistical outlier may be outside a statistical mean plus a pre-determined number of standard deviations. The threshold setting is adaptively configured.

The master controller may be further configured to: summarize information encoding physical locations of defect region on the plurality of NVRAM devices; and store the summarized information for persistent storage. The master controller may be further configured to: drive decisions managing subsequent I/O operations on the plurality of NVRAM devices in view of the summarized information stored.

The master controller is further configured to: report, to the host computing device, the at least one occurrence of data error after a number of occurrences of data error have been determined to surpass a threshold number of occurrences; and when reporting, summarize the number of occurrences of data error. The master controller may be further configured to: cause the host computing device to upload the summarized information to a central server, wherein the central server is configured to the summarized information to determine the threshold setting in subsequent manufacturing and deployment of the plurality of NVRAM devices.

The master controller may additionally be configured to: project the reported at least one occurrence of data error from a flash plane in which the at least one occurrence of data error has been identified to a die that includes the flash plane, or to a package that includes the die.

Implementations of the above techniques include a method, computer program product and a system. The computer program product is suitably embodied in a non-transitory machine-readable medium and includes instructions executable by one or more processors. The instructions are configured to cause the one or more processors to perform the above described actions.

The system includes one or more processors and instructions embedded in a non-transitory machine-readable medium that are executable by the one or more processors. The instructions, when executed, are configured to cause the one or more processors to perform the above described actions.

The details of one or more implementations of the subject matter described in this specification are set forth in the accompanying drawings and the description below.

BRIEF DESCRIPTION OF THE DRAWINGS

Figure 1A:
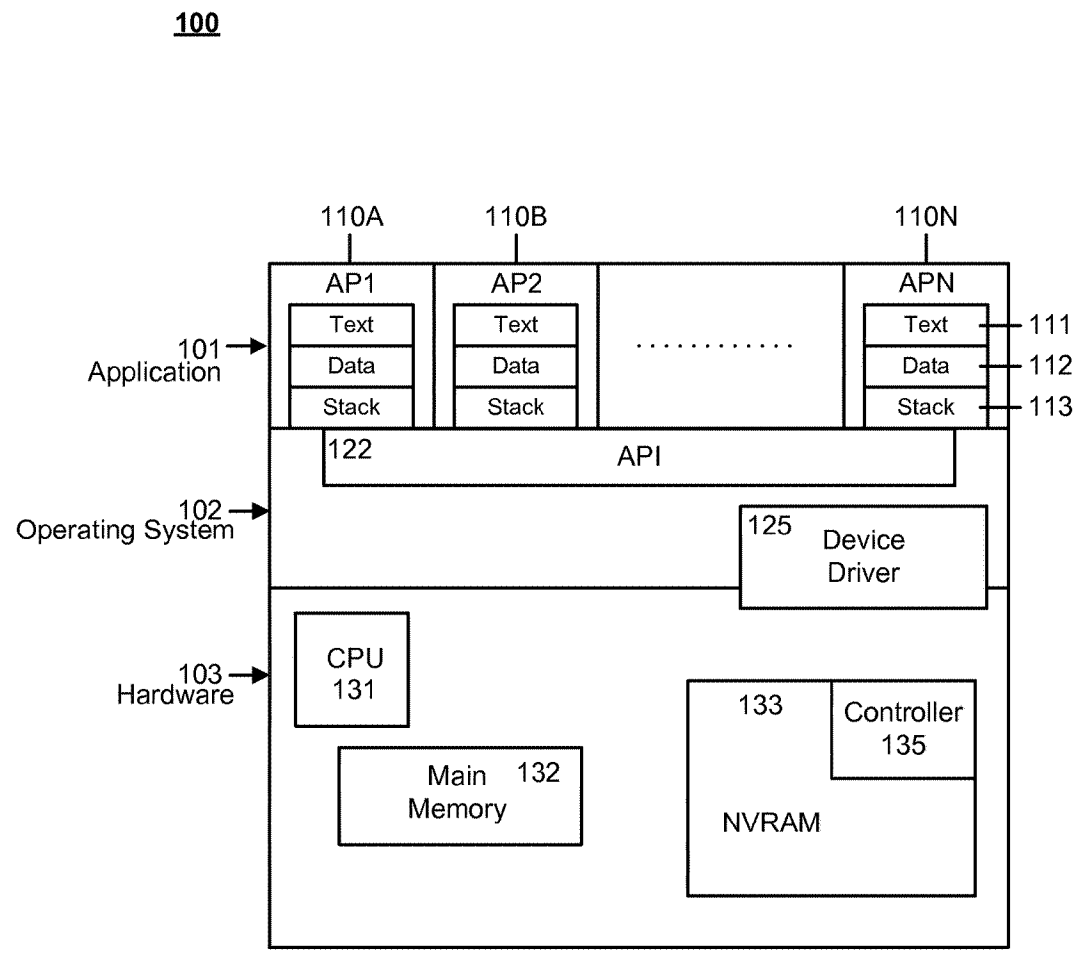

FIG. 1A is a diagram illustrating a host computing device and a NVRAM in accordance with some implementations.

DETAILED DESCRIPTION

Figure 1B:
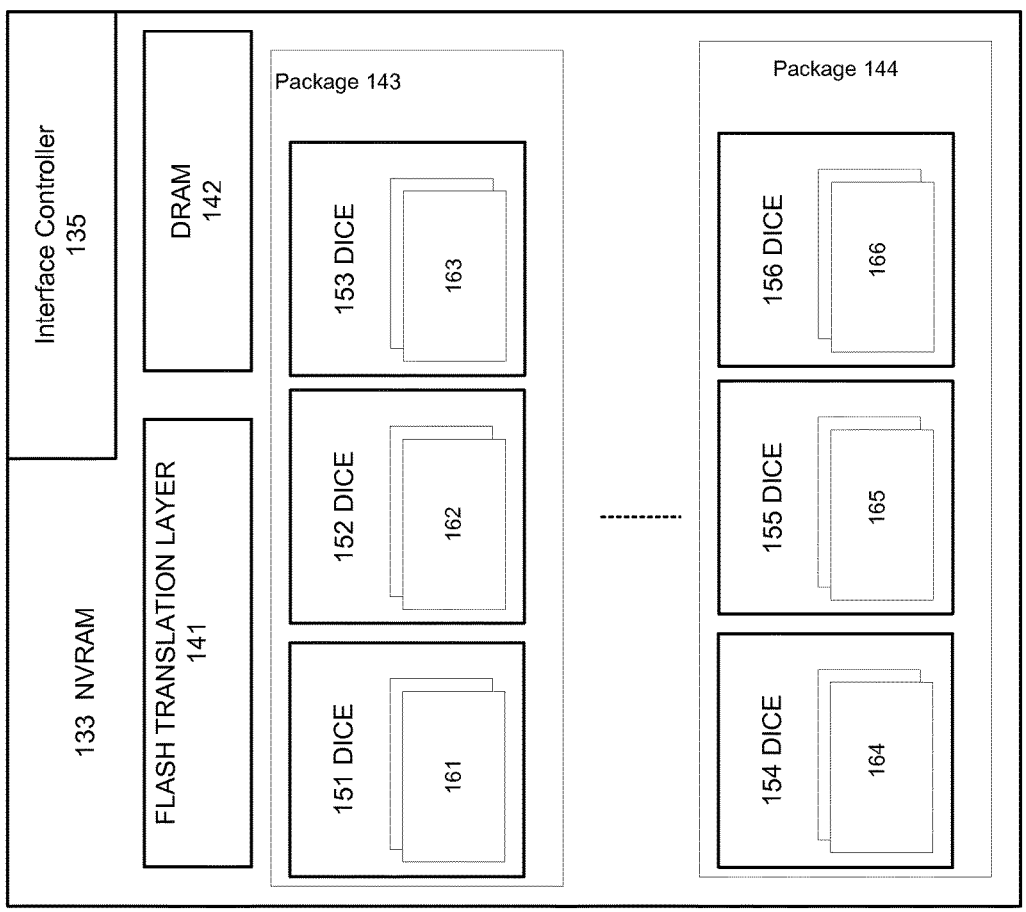
FIG. 1B is a diagram showing an example NVRAM device according to some implementations.

Non-volatile memory devices, such as NOR and NAND flash devices, may be configured to act as storage-class devices used for enterprise data storage and Internet data center applications. Such data storage applications may include, for example, back-up file servers, large database application to respond to user queries, distributed directory services to provide on-line white-page service, and other applications associated with cloud computing to provide some form of cloud service. In some data storage applications, the NOR and NAND flash devices may serve as adjuncts to mechanical rotating media storage devices.

In contrast to SRAM or DRAM, these non-volatile memory devices (NVMDs) do not require constant refreshing currents to hold data contents stored on the flash media memory cells. For example, the NVMDs can hold data contents for decades without refreshing currents. On the other hand, data contents stored on these NVMD devices may or may not be accessed with granularity for other types of memory (such as the volatile memory). Two types of flash memories have been mentioned above, namely NAND and NOR. These two types of flash memories have different underlying logic gate arrangement of each cell. NAND flash memory may be written and read in blocks (or pages) which are generally much smaller than the size of the entire device but substantially larger than a single byte. In comparison, NOR flash memory may allow a single machine word (byte) to be written or read independently. In addition, the NVMDs may include emerging types of memory, such as phase change memory.

On these NVMDs, the latency of each I/O operation may depend on the density or the processing technology of the non-volatile memory devices as well as the presence of a weakness (or degradation) in a particular region, as illustrated below.

On these NVMDs, flash memory stores data in individual memory cells using floating-gate transistors. Various memory cell technologies have been developed, including, for example, single-level cell (SLC) and multi-level cell (MLC). A SLC may have two possible states and thus encode one bit of data. A "0" or "1" is determined by the threshold voltage Vt of the flash cell. The threshold voltage can be manipulated by the amount of charge put on the floating gate of the flash cell. A flash memory chip based on SLC memory cells may be referred to as a SLC flash memory. In comparison, an MLC may allow more bits to be stored using the same number of transistors per cell. A flash memory chip based on MLC memory cells may be known as MLC flash memory. Some MLC cells may encode two bits of information, namely "11", "10". "01" and "00". The encoding is determined by a finer division the threshold voltage Vt of a particular flash cell, which in turn is manipulated by the amount of charge put on the floating gate of the particular flash cell. Noteworthy is that some flash cells may encode more than 2 bits of information. In fact, some flash cell may encode, for example, 3 bits of information, by an even finer division of the threshold voltage range. This increased number of states reduces the amount of margin in threshold voltage that separates the encoded states. The reduced margin results in an increased occurrence of more errors in I/O operations such as read and write on MLC flash memory than on SLC flash memory of comparable sizes. MLC flash memory designed for relatively low I/O error rates are sometimes called enterprise MLC (eMLC) flash memory.

The read speeds between SLC and MLC may be comparable. Reading the charge level of the flash cell compares the threshold voltage using a voltage comparator. Thus, the architecture difference between SLC and MLC does not affect sensing. In general, the read speeds of flash are determined by which controller is used.

SLC flash memory may have the advantage of faster write speeds, lower power consumption and higher cell endurance. Due to faster transfer speeds and longer life, SLC flash technology is used in high-performance memory cards. However, because the SLC flash memory stores less data per cell, it costs more per megabyte of storage to manufacture.

In comparison, the main benefit of MLC flash memory may include its lower cost per unit of storage due to the higher data density. However, MLC flash memory may be more prone to I/O errors than SLC flash memory of comparable size. More sophisticated error detection and correction algorithms may be relied on to handle these I/O errors. Other drawbacks of MLC flash memory may include lower write and erase speeds, lower number of program-erase cycles and higher power consumption compared to SLC flash memory of comparable size.

Thus, SLC flash memory tends to provide faster memory access than MCL flash memory of a comparable size. However, SLC devices generally provide smaller capacity per unit cost than a comparable MLC device. A MLC device may experience noisier I/O characteristics relative a SLC in in terms of increased likelihood of I/O errors.

Once a particular type of NVMD has been configured as a storage-class device, the performances of these non-volatile memory devices may be operation-specific. As used herein for this application, these non-volatile memory devices adapted for storage-class applications may be referred to as non-volatile random access memories (NVRAMs) to differentiate from dynamic random-access memory (DRAM) and hard disk devices (HDD) that do not provide random access to memory, only serialized storage in cylinders, headers, and sections accessible through mechanical rotating and scanning arm(s). In this context, NVRAM and NVMD may be used interchangeably in this application.

The NVRAM device may perform certain classes of memory operations (e.g., read operations) much faster (e.g., more than one hundred times faster than hard disk devices having rotating disks and an array of mechanical arms to access a particular cylinder, header, or segment of the rotating disks). Nonetheless, the non-volatile memory devices may have physical limitations that result in other memory operations that are not only slower than operations associated with dynamic random access memory (DRAM), but also slower than other NVRAM operations. For example, write and erase operations of a NVRAM device may be much slower than read operations on the NVRAM devices. This asymmetry in I/O access time is known as an asymmetry characteristic of the NVRAM devices. Furthermore, the I/O operations may have different minimal data sizes. For example, erase operations may be performed per erase block, write operations may be performed per write page, and read operations may be performed per read page. One erase block may be the size of several write pages. One write page may be the size of several read pages.

In addition, the NVRAM may have certain "wear" characteristics that result in degraded performance over time, particularly as more write and erase operations are performed. In simple terms, weaker (or degraded) regions of the NVRAM device may develop (or increase) over time. The weaker (or degraded) regions of the NVRAM device may have I/O performances worse than other areas of flash memory on the NVRAM device. For example, weaker regions of the NVRAM device may exhibit slower read, write, or erase speed, higher error rate, etc. The weaker regions of the NVRAM device may have I/O performances worse than certain preferred values, which may be proprietary numbers heuristically set by the manufacturer, or standard numbers set forth in industry-wide guidelines. For example, weaker regions of the NVRAM device may have flash memory media with read, write, or erase speed lower than the recommended values, or more prone to encounter errors during read, write, or erase operations. Each NVRAM device may have an expected durability as weaker regions develop or increase in size. Further, each NVRAM device may have inherent manufacturing imperfections, manifested by weaker regions, when shipped to downstream integrators or customers. In the presence of weaker regions of the flash media, data integrity as well as data access speed need to be maintained. At the same time, I/O operations may be performed at various granularities, depending, in part, on the underlying flash media type. For NAND type memory media, read and write operations may be performed at a granularity of, for example, pages (also known as blocks) of, for example, 2 k to 16 k bytes at a time. For NOR type memory media, the read and write operations may be performed at the granularity of each byte. The apparent performance of reading/writing a particular data size on a flash media depends on the granularity of the I/O operation to execute the read/write operation, and hence depends on the processing technology of the underlying flash memory media.

The NVRAM device includes slave controllers and/or master controllers to monitor the I/O access pattern on the flash memory media of the NVRAM device. Multiple NVRAM devices may be included in an NVRAM-based storage subsystem. The NVRAM-based storage subsystem may employ multiple levels of controllers to coordinate operations among each individual NVRAM device. Such NVRAM-based storage subsystems may be deployed, for example, in enterprise storage applications. In these NVRAM-based storage subsystems, the controllers may be organized into a hierarchy including: slave controllers, which coordinate operations on a subset of NVRAM devices, and master controllers, which coordinate multiple slave controllers. The slave controllers may be in communication with the master controller.

A slave controller may monitor flash media access pattern of the NVRAM device that houses the slave controller. The monitored flash memory access pattern may be stored in the memory of the slave controller. The memory of the slave controller may include a portion of a flash memory media of the NVRAM device. The memory of the slave controller may also include a portion of DRAM on the slave controller. The slave controller may report the monitored access pattern to a master controller in the NVRAM-based storage system. The reported access pattern from various slave controllers on respective NVRAM devices may allow the master controller to obtain up-to-date information on the flash media access pattern across all constituent NVRAM devices of the NVRAM-based storage subsystem. Based on the up-to-date information of the constituent NVRAM devices, the NVRAM-based storage subsystem may improve its overall I/O performance by, for example, wear leveling, loading balancing, etc. The update-to-date information obtained from the constituent NVRAM devices may also provide guidance for improving the manufacturing process of the NVRAM devices, as will be discussed in detail later in this application.

FIG. 1A is a diagram illustrating a host computing device 100 with a NVRAM in accordance with some implementations. On the host computing device 100, user applications 110A to 110N are running at the application level 101. Each running user application may correspond to a process with segments that may include, for example, text 111, data 112, and stack 113. The segments may further include a heap. The Operating System 102 provides an Application Program Interface (API) 122 for the user applications 110A to 110N to access underlying services. In some implementations, device driver 125 may be part of OS 102 to allow high-level user applications 110A to 11N access to hardware devices on host computing device 100. The high level user applications also may be configured to access device level instrumentation and device controls. Device driver may also be part of the OS 102 in other implementations.

Host computing device 100 includes a hardware layer that includes a central processing unit (CPU) 131, main memory 132 that is typically a volatile memory, and non-volatile random-access memory (NVRAM) 133 with a controller 135. The flash memory media may be located on several cards. The cards may be peripheral component interconnect (PCI) cards to be installed on the motherboard of the host computing device using the peripheral component interconnect express (PCIe) edge connector. The motherboard of the host computing device houses CPU 131 and main memory 132 such as dynamic random access memory (DRAM). Host computing device also may include a hard disk device with mechanical arms that may utilize, for example, NVRAM 131 as an adjunct.

Each PCI card may have two types of controllers for performing logical operations, namely, a master controller, which handles host-level interactions; and slave controller(s), which handles flash-level interactions. In some implementations, one physical device on a PCI card may include one master controller, and up to, for example, eight additional physical devices, each implementing two slave controllers. The additional physical devices also may be implemented on daughter boards inserted on a baseboard, a PCI card housing the physical device implementing the master controller. Other implementations may utilize two physical devices—each of which implements one master controller and up to, for example, six slave controllers. One of the master controllers is on the "baseboard" on the PCI expansion slot on the mother board of the computing device, and the other master controller is on the "daughter board" located on an expansion slot on the baseboard. Communication between the host and the daughter board's master controller is routed through the baseboard's master controller.

The master controller and the slave controller(s) may communicate using a proprietary hardware interface. In some implementations, this interface is implemented using pins on the physical devices and traces on the baseboard. In other implementations in which master controller and slave controller(s) are in the same physical device, the interface may be implemented using internal device logic on the physical device.

In the implementations utilizing two physical devices—each of which implements one master controller, communication between the two master controllers may be through the standard interface of PCIe. A proprietary hardware interface also may be feasible.

Acting in concert, the master controller(s) and slave controller(s) implement the data path of the system. In other words, the master controller(s) and slave controller(s) receive commands to perform flash level operations and carry these out against host DRAM resources. The data path aspect refers to the point that the controllers themselves do not determine which flash locations and which DRAM locations are involved in the above operations—this determination is made by the control path of the system. In this context, the data path may also be known as the "data plane," as commonly used in network communications.

The control path of the system is implemented by the driver software, which may be implemented as firmware instructions executed by embedded processors associated with the controllers. There may be only one "driver", per card. The driver software instructions allow each slave controller to communicate independently with the one or more master controllers. In this context, the control path may also be known as the control plane, as commonly used in network communications.

In some implementations, the data path communication may involve the direct memory access (DMA) transfer of data. For example, the driver software may generate DMA instructions including target memory addresses and initiate memory read or write cycles. The DMA instructions may utilize several registers on the master controller(s) or slave controller(s) that can be written and read by the CPU of the mother board or the embedded processors on the master controller(s). These registers may include a memory address register, a byte count register, and one or more control registers. The control registers specify the I/O port to use, the direction of the transfer (reading from the I/O device or writing to the I/O device), the transfer unit (byte at a time or word at a time), and the number of bytes to transfer in one burst.

To carry out an input, output or memory-to-memory operation, a DMA instruction may be issued from CPU to master controller(s) and then to the slave controllers on the corresponding NVRAM card to initiate transfer of data. The DMA instruction contains a count of the number of words to transfer, and the memory address whose contents are to be transferred. The master controller(s) then obtains access to the system main memory 132 for data transfer. Each time a word of data is ready to be transferred between the NVRAM card and the system main memory 132, the controller (master or slave) may increment its internal address register until the full block of data is transferred. The master and slave controller are capable of executing DMA transfers either occurring one word at a time or all at once in burst mode.

In some implementations, the driver software runs on the host computing device as device driver 125. It communicates with the master controller(s) on the card using standard PCIe commands—in standard terminology, the latter are referred to as "memory mapped I/O" (MMIO) instructions (they are load/store instructions at the CPU level, except that they get routed to the appropriate device instead of DRAM). The MMIO instructions may be used to initiate the DMA operations, as discussed above. The driver in turn receives requests from host CPU applications and operating system (e.g., the file system component), using standard host-based APIs and mechanisms (e.g., a system call).

In other implementations, the driver software runs on an embedded CPU coupled with the baseboard master controller. In these implementations, the term "firmware" is usually used to denote the driver software. In still other implementations, the driver functionality may run in a split/parallel fashion across more than one embedded CPU associated with one or more master controllers. In cases where the firmware runs on one or more embedded CPUs, the applications/operating system requests get communicated to the firmware using the same PCIe MMIO instructions, using an intermediate (separate, minimal) software driver, for example, installed on the host computing device.

FIG. 1B is a diagram showing an example NVRAM device according to some implementations. NVRAM 133 includes a controller 135 to interface with host computing device 100 and other NVRAM devices on NVRAM 133, as will be discussed in association with FIG. 2. NVRAM 133 may also include a flash translation layer (FTL) 141 to map an access request for data in a logic address space to the corresponding physical flash block address. In some implementations, the flash translation layer (FTL) 141 may be realized as part of device driver 125 on host computing device. FTL 141, in conjunction with device driver 125 and the operating system on the host computing device 100, may make linear flash memory appear to the system like a hard disk drive. In this role, FTL 141 may perform a number of specific functions. First, FTL 141 may create "virtual" small blocks of data, or sectors, out of flash's large erase blocks. Next, FTL 141 may manage data on the flash so that the data appears to be "write in place" when in fact the data is being stored in different locations in the flash, over time. Finally, FTL 141 may manage the flash so there are clean/erased flash locations to store data.

Specifically, a particular OS may have block device drivers that perform input and output in structured pieces called blocks. Block devices include all disk drives and other mass-storage devices on the host computing device 100. In some implementations, FTL 141 may emulate a block device. The emulated block device may render the flash media of NVRAM 133 appear, to a user on host computing device 100, as a contiguous array of storage blocks numbered from zero to one less than the total number of blocks. FTL 141 may thus server as a translation layer between the native operating system (OS) file system (FS), such as, for example, DOS BPB/FAT, WINDOWS NTFS, UNIX FS, etc., and the underlying flash media. Moreover, FTL 141 may remap the data to the physical location at which the data is to be written. This allows the native OS file system to treat flash media on a NVRAM device like any other block storage device and remain ignorant of physical characteristics of the flash media on the NVRAM device. To the user on computing device 100, FTL 141 may appear to simply take the data from the file system and write it at the specified serial location (e.g., a consecutive sector). To the underlying flash media on the NVRAM device, FTL 141 places the data at a free/erased location on the flash media and notes the physical location where the data is placed. As a result, when the file system requests for the data that has been placed on the NVRAM device, FTL 141 finds and reads back the proper data. FTL 141 may have its own cache, for example, flash memory media or DRAM, to store such information.

NVRAM 133 may include flash memory media organized in a hierarchy. First, NVRAM 133 includes a card of NVMD. The card can be a PCIe card utilizing the PCI interface and located on a PCI expansion slot of the motherboard of host computing device 100. Such a card may also be known as the baseboard. The card also can be a daughter board mounted on a base board.

Each card of NVMD includes a series of packages, for example packages 143 to 144. Each package may include a series of dice, for example, dice 151, 152, 153 on package 143, dice 154, 155 and 156 on package 144. Each die may include one contiguous semiconductor substrate on which flash media cells are fabricated. In this context, a die may be represented or referenced as a memory chip, and the terms "die" and "chip" are used interchangeably. Each flash media cell is a storage cell that includes a control gate, a floating gate, a source region, and a drain region. Depending on the configuration of the control gate and the floating gate, the flash media may be NAND type or NOR type. Depending on the processing technology of the floating gate, a given flash media cell may be an SLC cell or a MLC cell, as discussed above. The flash media cells on a particular NVRAM device may be processed using the same technology and under the same configuration.

Each die may include a multitude of flash planes, for example, planes 161, 162, 163, 164, 165, 166 respectively on dice 151, 152, 153, 154, 155, and 156. A flash "plane" is a physical sub-die structure and each die may have an even number of flash planes. For a die with two planes, it essentially has two distinct sub-regions—each with their own array of memory cells and interface circuitry. The die may include a simple demultiplexing structure, which sends out commands to one plane or the other (or in some cases, to both planes).

Each flash plane may include constituent blocks of media cells, arranged in collections referred to as erase blocks. Erase blocks may be, for example, 1 MB to 4 MB in size, and represent the smallest unit of flash memory media that can be erased using a single erase operation. Each erase block may in turn contain multiple smaller granularity of write blocks, which represent the smallest granularity of flash memory media that can be written to using a single program operation. The write blocks may be, for example, 2 KB to 16 KB in size. Each write block must first be erased before data contents can be written to the write block. Each write block of media cells may be further divided based on the smallest unit for accessing data contents stored on the flash memory media. For example, for NAND type of flash memory cells, read operations may be performed in blocks (or pages) of size 512 bytes-16 KB.

NVRAM 133 may additionally include dynamic random-access memory DRAM 142 to serve as a buffer between main memory 132 and each constituent package. Both FTL 141 and controller 135 may include additional DRAM of their own.

Figure 2:
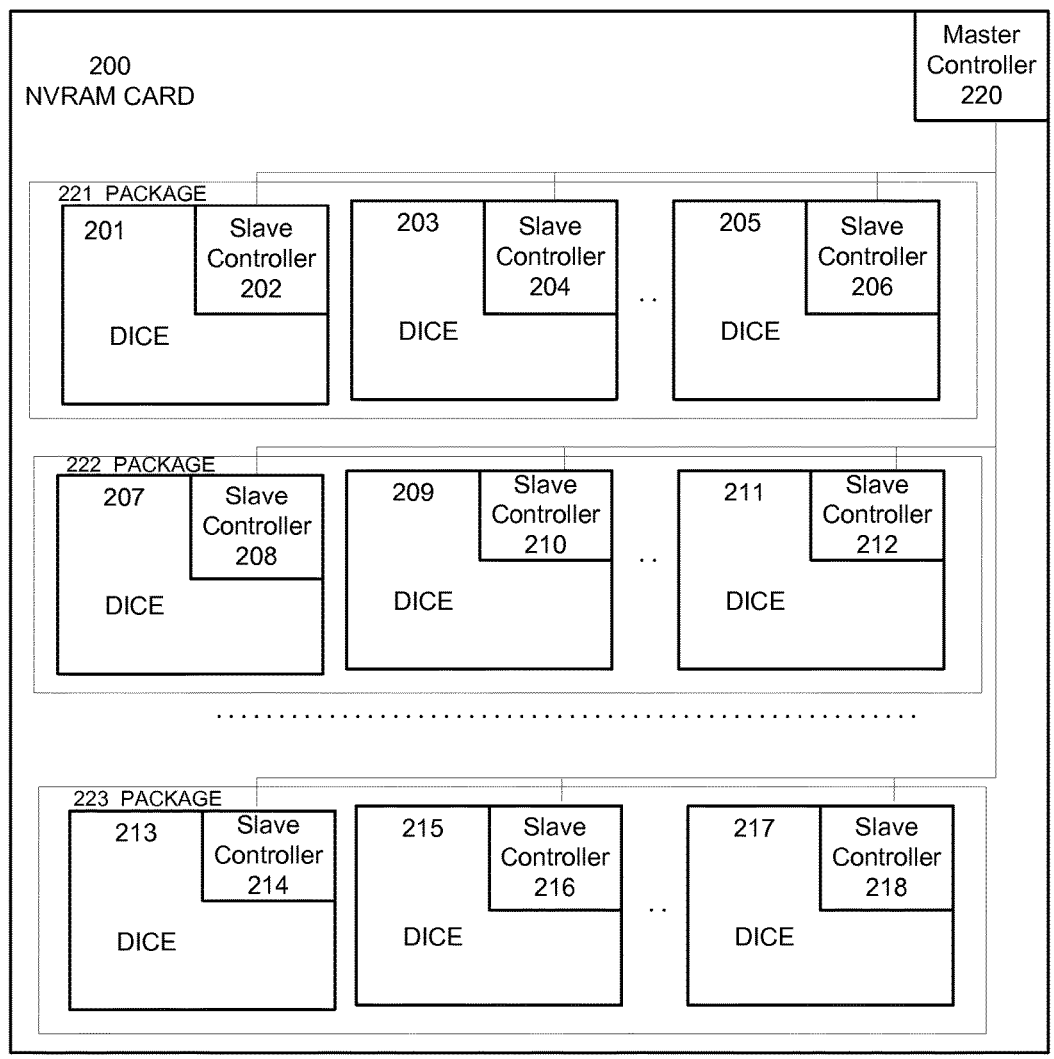
FIG. 2 is a diagram of an example NVRAM card with multiple levels of controllers according to some implementations.

FIG. 2 is a diagram of a NVRAM-based storage subsystem NVRAM card 200 according to some implementations. NVRAM CARD 200 may include packages 221, 222, and 223. Package 221 may include NVRAM devices 201, 203, and 205. Package 222 may include NVRAM devices 207, 209, and 211. Package 223 may include NVRAM devices 213, 215, and 217. These packages may be configured to provide data redundancy using a redundant array of independent disks (RAID) mechanism, as outlined in co-pending patent application 61/746,679. The configured NVRAM-card 200 may store data redundantly in data stripes distributed across packages 221 to 223. In this context, packages 221 to 223 may also be referred to as RAID groups 221 to 223. The grouping can be either static, i.e., predetermined and fixed, or dynamic, i.e. adjustable due to re-striping resulting from I/O errors. Also in this context, a sub-section of a flash memory die may be a region of flash memory media within a die, such as a write page, an erase block, a sector or some suitable logical or physical portion of the flash memory die. When a subsection of flash memory die is in a weakened (or degraded) state, only the data in the degraded sub-section of the flash memory die is replaced, either from mirrored copies replicated elsewhere for reliability, or reconstructed from a parity-based encoding of the data spread across multiple dice. Subsequently, the flash memory die is dynamically re-striped into different planes (or packages), taking into account the weakened (or degraded) portion of the flash memory die. Details of dynamic re-striping can be found in a companion patent application 61/746,679.

A NVRAM device may be a NVMD device on the peripheral component interface (PCI) bus of the host computing device. The NVRAM device may also be mounted on other type of buses, such as Dual In-line Memory Module (DIMM), AT Attachment (ATA), Serial ATA (SATA), SATA express (SATAe), Small Computer System Interface (SCSI), etc. A NVMD device in this configuration may be known as a baseboard. Some NVRAM devices may be implemented as daughter boards mounted on a baseboard.

Each NVRAM device on a package (or a RAID group) may have a slave controller that controls the read, write, and erase memory operations on the NVRAM device. The slave controllers 202, 204, 206, 208, 210, 212, 214, 216, 218 on the respective NVRAM devices may be connected to the master controller 220 by a plurality of master-slave memory bus channels, which may be implemented as PCB traces on the baseboard of NVRAM card 200. Each slave controller may be mounted on the package or on the baseboard. Each slave controller may be configured for providing transparent access to the hosting NVRAM device. Each slave controller may include microinstructions tuned for memory operations on flash planes of each NVRAM device. Each slave controller may also include an embedded processor having firmware instructions for performing the same memory access functions.

As illustrated by FIG. 2, NVRAM card 200 may include a master controller 220 in communication with each slave controller on the constituent NVRAM devices of the packages 221, 222, and 223. Master controller 220 may have an embedded processor to execute firmware instructions for read, write, erase, and maintenance operations in coordination with the slave controllers on the slave NVRAM devices of each RAID package. Master controller 220 natively controls the flash memory dice to obtain predictable bandwidth and latency performance with the flash memory dice included in the packages 221-223. All operations that take place on the flash memory dice 201, 203, 205, 207, 209, 211, 213, 215, and 217 (for example, read, write, erase, control operations such as reset, etc.) are completely visible to (and under the control of) the master controller 220. The flash memory interface of a given flash die in a particular package is passed through the respective slave memory controller to the master controller 206. For example, the flash memory interface of the die 201 is passed through the slave controller 202 to the master controller 220.

In this context, device driver 125 on host computing device, along with master controller 220 and each slave controller, may be configured to perform a plethora of operations to improve I/O operation performance on a NVRAM-based storage subsystem. The operations may include, for example, error correction, wear leveling, bad block mapping, read scrubbing or read disturb management, write disturb management, read and write caching, garbage collection, and encryption, etc.

Specifically, the master controller(s) and slave controllers of NVRAM card 200 implements the data path of the system in which data is transported between main memory 132 and the flash memory media of each NVRAM device of the RAID device. The data path of the flash operations may include, for example, data transfers, operation scheduling, etc. In this context, the data path may also be known as the "data plane."

In comparison, the control path determines, for example, the I/O location of I/O operations and the block size of the I/O operations. As discussed above, the control path of flash management activities is implemented by the driver software, which may be implemented as firmware instructions executed by CPU 131 on host computing device 100, or by embedded processor(s) on master controller 220. In this context, the control path may also be known as the control plane.

Error correction may include both detection and correction of flash media errors. Error detection identifies inconsistencies in memory access operations. Error detection may use techniques such as repetition codes, parity bits, checksums, cyclic redundancy checks (CRCs), as well as other cryptographic hash functions. Error correction attempts to cure the identified inconsistencies. Error correction may utilize a variety of techniques such as automatic repeat request, error-correcting code (ECC), etc. Example ECC algorithms may include Reed-Solomon algorithm, Hamming algorithm, and Bose Ray-Chaudhuri Hocquenghem (BCH) algorithm, etc.

A NVRAM device includes flash blocks, each of which can be put through a limited number of erase cycles before exhibiting unreliable behavior. For example, a MLC NAND flash block may withstand 3000-10000 cycles of erase operations before accesses to it return more errors than can be corrected with reasonable implementation complexity. To cope with problems associated with device wear, wear leveling techniques attempt to spread out write operations evenly across all flash segments.

Wear leveling techniques may be dynamic in which the FTL 141 uses a map to link Logical Block Addresses (LBAs) of the file system to the physical flash media in a memory hierarchy as discussed above. Each time the application or an OS component, for example the file system, writes replacement data, the map is updated so that the original physical block is marked as holding invalid data, and a new block is linked to that map entry. Each time a block of data is re-written to the flash memory, it is written to a new physical location on the flash media and the map is updated accordingly to reflect the re-write. However, blocks that never get replacement data sit with no additional wear on the flash memory. The device may be configured so that only dynamic data is recycled. Under the dynamic approach, the NVRAM device may last longer than one with no wear leveling, but there are blocks still remaining as active that will go unused when the drive is no longer operable. Wear leveling techniques also may be static in which the static blocks that do not change are periodically moved so that these low usage cells are able to be used by other data. Wear leveling techniques may additionally include setting aside the static blocks that do not change until other blocks are as worn as the static blocks. The rotational effect associated with the static approach may enable the NVRAM to operate until most of the blocks are near their end of life.

Flash memory blocks have to be explicitly erased before they can be written to. The time taken to erase blocks can be significant. To reduce latency of write, when the information stored at a flash block is to be updated, the controller may be programmed to write a new copy of the changed data over to a fresh block, remap the memory pointers, and then erase the old block later, as a background operation, when there are fewer memory access requests pending.

Together with device driver 125, the master controller 220 and slave controllers may perform read scrubbing or read disturb management. Read scrubbing refers to the process of detecting and correcting bit errors during a read operation and using error detecting codes, such as ECC code, to correct the bit error. A read disturb refers to an I/O error when one or more bits are changed during a read operation. Read disturb errors occur within the block being read, but on a page or pages other than the page being read. Performing a large number (e.g., hundreds of thousands or millions) of read operations on individual pages before an erase command for the block that includes those pages can exacerbate this error. To recover from this type of error, master controller 220 and slave controllers may be programmed to erase the block where the error occurred and rewrite the data to that block.

Together with device driver 125, the master controller 220 and slave controllers may additionally perform "write disturb" management—where a write to a flash cell disturbs the data in another neighboring region in the same write page. In some implementations, write disturb management handling is accomplished by controlling the order in which flash cells are written. In some other implementations, write disturb management handling is accomplished by limiting the subset of cells that receive writes as the device approaches end of life (at the expense of reducing device spare capacity).

Together with device driver 125, the master controller 220 and slave controllers may additionally perform read and write caching. A NVRAM device 133 may include on-chip DRAM 142. Using on-chip DRAMs as a buffer, master controller 220, in combination with slave controllers, may cache information for a read or write operation in accordance with the respective predicted data access patterns. Caching may generally boost the apparently I/O performance as measured in, for example, throughput, apparent access time, etc.

Together with device driver 125, the master controller 220 and slave controllers may additionally perform garbage collection. After every block of a NVRAM device has been written once, the flash controller will need to return to some of the initial blocks which no longer have current data (also called stale blocks). These stale blocks may correspond to data no longer being used by an application program. The data in these blocks may have been replaced with newly written blocks and now they are waiting to be erased so that new data can be written into them. This is a process called garbage collection (GC). As discussed above, GC may be a background task for the master controller 220 and slave controllers in the sense that GC may be performed when there are few pending I/O requests.

Together with device driver 125, the master controller 220 and slave controllers may additionally perform encryption by using a variety of encryption algorithms, including, but not limited to, symmetric encryption and asymmetric encryption. Symmetric encryption may employ, for example, any block cipher algorithm in existence or being developed. Example block algorithms may include, data encryption standard (DES), advanced encryption standard (AES), blowfish, International Data Encryption Algorithm (IDEA), RC5, etc.

Master controller 220 and slave controllers may be further configured for monitoring I/O performance metrics of a NVRAM device and mapping bad blocks. I/O performance monitoring and mapping may be accomplished by a combination of hardware and software solutions. The hardware components of an example NVRAM device have been described above. The software configurations may include implementations through device driver 125 and API 122, as shown in FIG. 1. API 122 may provide an interface for user applications to access NVRAM devices through device drivers 125. A user application may trigger I/O requests to access the NVRAM devices. For example, a user application may attempt to open a file and read the contents of the file, or the user application may query a database for entries matching search criterion.

The I/O requests may be initially sent from the device driver 125 to the master controller 220 on host computing device 100. The master controller 220 may then coordinate the distribution of the I/O requests to the slave controllers on the NVRAM device holding informational content to which the I/O requests are addressed. The I/O requests may then be pushed to the slave controllers in a non-blocking manner in which the master controller 220 does not stay idle to wait for the responses from the slave controllers. Instead, the master controller 220 may continue with other scheduled tasks. When the response from the slave controllers arrives, follow-up actions may be invoked at the master controller 220 as well as the device driver 125 to coalesce the responses and relay the information back to the user application that triggered the I/O requests. As discussed above, the non-blocking and blocking data transfers may be implemented as DMA data transfers.

Figure 3:
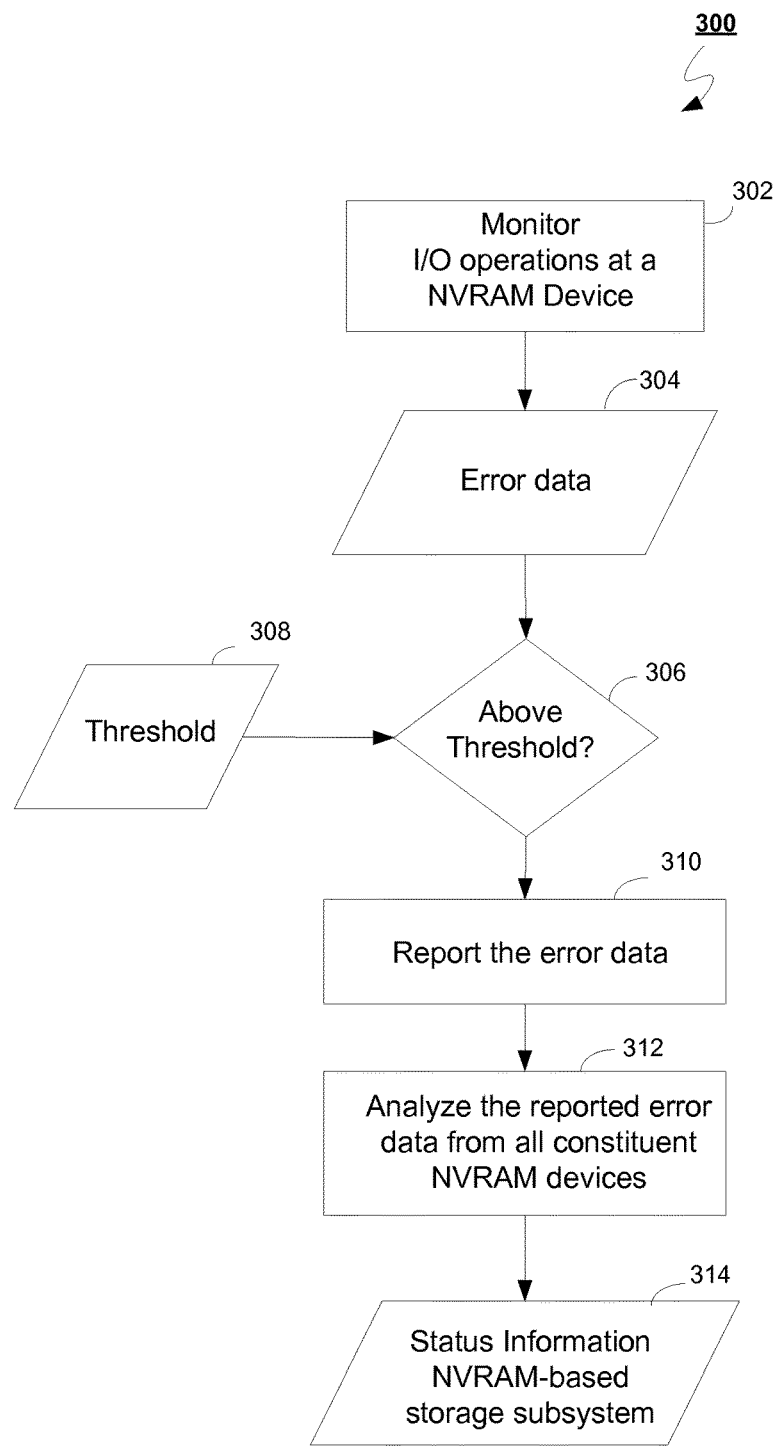
FIG. 3 is a flow chart of monitoring metrics and reporting I/O errors according to some implementations.

FIG. 3 shows flow chart 300 for monitoring metrics and reporting I/O errors according to some implementations. A combination of hardware and software solutions, as discussed above, may act in concert to monitor a performance metric of I/O operation at each NVRAM device of a NVRAM-based storage subsystem (302). The performance metric may pertain to the duration of an I/O operation, such as, a read, a write, or an erase. In some implementations, the duration time of an I/O operation being monitored may include the program time for writing and reading from a buffer. The performance metric being monitored may also include number of correctable errors or error rate for the I/O operations. The correctable errors may be identified by an error checking mechanism, such as, for example, a check sum, a cyclic redundancy coding (CRC) or an error-correcting code (ECC). A correctable error, once detected, may be corrected by, for example, an ECC coding mechanism. A related performance metric may be the bit error rate that represents failing bits corrected with appropriate levels of ECC. A raw bit error rate (RBER) may represent bit error rate prior to ECC. Since the correctable bit errors do not result in data loss, an uncorrectable bit error rate (UBER) may indicate the amount of data loss under a given ECC implementation. Typically, the performance of a given ECC coding scheme correlates with the amount of spare space allocated to each read/write page (block). Often times, an NVRAM device may need more spare space of ECC to achieve a lower UBER, for example, under $10^{-17}$. In some implementations, the spare space may allow correction of up to 80 bits per 1 kB of data for a 20 nm class NAND flash device. In some implementations, error rate or correctable error may be monitored on a per operation basis at the level of each bit/bite being accessed at run-time. In other implementations, the error rate or correctable error may be monitored on a summary basis, for example, an aggregate of many operations or an aggregate of bits/bytes being accessed at run-time. Master controller 220 and slave controllers on each NVRAM device may perform the tracking and monitoring operations.

Master controller 220 may coordinate slave controllers 202 to 218 to monitor an I/O operation on the respective hosting NVRAM device. For example, when measuring the speed of an I/O request, master controller 220 may send the I/O request for data contents at a particular memory location to a slave controller in charge of that particular memory location. In some implementations, the request may be sent at time 1 with a time stamp on the master controller. The slave controller in charge of that particular memory location may return the data contents at the requested memory location. When the master controller receives the data contents at time 2, it may generate a new time stamp. The difference between the two time stamps indicates the duration for the read/write operation at the particular memory location. In these implementations, the time stamps may be issued according to a local clock on master clock 220. In other implementations, the slave controller, upon receiving the I/O request, may timestamp the receipt time. Upon completion of the requested I/O operation and before the result is returned to master controller 220, the slave controller may timestamp the competition time. The difference between the completion time and the receipt time may be reported by the slave controller back to the master controller 220 as the duration for the I/O operation at the particular memory location. In these implementations, the timestamps may be issued according to a local clock on the slave controller. In still other implementations, if the I/O operation is implemented as a blocking operation in which the issuing process or thread waits for the I/O operation to finish, the application process or thread may simply measure the time elapsed between when the I/O request is issued and the result is returned. In these implementations, the time may be measured according to a system clock on motherboard of host computing device 100.

For example, when measuring an error rate of an I/O request, master controller 220 may send the I/O request for data contents at a particular memory location to a slave controller in charge of that particular memory location. The slave controller in charge of that particular memory location may execute the I/O request to, for example, retrieve a 4 k page of data contents in response to a read request. The data contents are obtained with parity checking codes for verification of data integrity. In some implementations, the slave controller may perform parity checking of the obtained data contents and then compare the checking result with the parity checking codes. Based on the comparison, the slave controller may correct errors in the data contents received, if correctable. Thereafter, slave controller may report the error, or correctable error, to the master controller. The reporting may be delayed, to consolidate a threshold number of errors or correctable errors in one report. The threshold number may be a proprietary number determined heuristically. The threshold number also may be a standard number agreed upon by chip makers and original equipment manufacturers (OEM). The reporting may be triggered by, for example, a counter on the slave controller indicating a threshold number or errors or correctable errors have occurred. The reporting may be triggered by an instruction from master controller 220 in the control path to request reporting from slave controller. The reporting also may be periodic when a pre-determined period of time has elapsed. The reporting may be based on results of comparison of the measured performance characteristics and a threshold setting. The reporting may occur as a result of the comparison result. The information reported may include data used for the comparison. The data itself may be yielded as a result of the comparison, e.g., a flag of 1 for comparison true, and a flag of zero for comparison false.

In other implementations, slave controller may refrain from error checking or correction for read operations. Instead, master controller 220 conducts error checking and correction upon receipt of the requested data contents. Thereafter, master controller may coalesce the identified errors or correctable errors before reporting to host computing device. The coalescing may consolidate a threshold number of errors or correctable errors in one report. The threshold number may be a proprietary number determined heuristically. The threshold number also may be a standard number agreed upon by chip makers and original equipment manufacturers (OEM). Reporting to host computing device 100 may be triggered by, for example, a counter on master controller 220 indicating a threshold number or errors or correctable errors have occurred. The reporting may be triggered by a request from device driver 125 on host computing device for information on error counts or error rate. Reporting to host computing device 100 may be periodic, e.g., whenever a pre-determined period of time has elapsed.

The granularity of the I/O operation being tracked for monitoring a performance metric may vary across implementations. Some implementations may track the I/O operations at the granularity of an individual write page. Example write pages may range in size from, for example, 2 kB to 16 kB. Some implementations may track the performance for each erase block which may include multiple write pages. Others implementations may track the I/O operations at coarser granularities, such as, for example, at the granularity of each die plane (which includes multiple erase blocks), at the granularity of each flash die (which includes multiple die planes), at the granularity of each package (which includes multiple flash dice), or at the granularity of each card (which includes multiple packages).

The granularity of tracking and monitoring may be a function of the age of the NVRAM devices of the NVRAM-based storage subsystem. Earlier on in their expected life time, the granularity can be coarser as the I/O operations are expected to run smoothly then. Later on in the life time of the NVRAM device, the granularity may be finer due to an increased likelihood of errors and degradation in the I/O operations. The granularity of tracking and monitoring may hinge on the specific application utilizing the NVRAM-based storage subsystem. For applications in which data integrity and reliability may be a paramount concern, such as remote and distributed database applications demanding atomic operations for data coherence across distributed data storage locations, the granularity of tracking and monitoring may be finer. For applications in which data throughput may be favored over data integrity, such as, for example, routine data back-up for an e-commerce data server, the granularity may be coarser.

The frequency of monitoring the I/O operations may also vary across implementations. The monitoring frequency can be configured for each NVRAM device according to a user preference. For example, for routine data back-up on a campus network, the user may prefer less frequent and more sporadic tracking and monitoring of I/O operations. For example, for banking applications or high-frequency trading applications, the user may prefer more frequent and less sporadic tracking and monitoring of I/O operations.

In some implementations, the request for tracked information may be issued by an application program and then queued at master controller 220. For example, master controller 220 may receive 4 kB-sized I/O requests and may distribute them to four (4) slave controllers, each receiving 1 kB-sized I/O requests. Each slave controller may send request completion packet to master controller 220 to signal that the requested information is available. The slave controllers may execute the received requests and respond with the completion packet out of the order in which the requests were received, given the different load conditions on each slave controller. The completion packet arriving at the master controller 220 may trigger a follow-on action at the master controller 220. In response, the master controller may match a given completion packet to a particular request that was sent to the slave controller. Master controller 220 may further rearrange/reorder the completion packets from the slave controllers to which the requests were sent. Once all completion packets have been received, master controller 220 may coalesce the completion packets and reply to the requesting application with the requested information. In other implementations, the slave controllers may sua sponte track the performance metric of I/O operations on the NVRAM device and then periodically send the tracked performance metrics to master controller 220. Depending on the overall load conditions of the controllers on the NVRAM device, the slave controllers can be configured to track the I/O operations sua sponte, or at the request from master controller 220.

The tracked I/O operations may generate error data 304. In this context, error data may generally refer to metrics tending to show I/O errors, error rates, correctable errors, as well as I/O operation durations. Error data 304 may be compared (306) with a threshold setting, the crossing of which may cause an error report to be generated at slave controllers and then propagated to master controller 220. The threshold 308 may be a cut-off bar. For example, the threshold 308 may be a duration threshold associated with a memory operation, such as a read, write, or erase. The duration threshold may be the upper limit for the memory operation, the surpassing of which triggers an error report. The duration threshold may also be a time-out value, beyond which the memory operation will be aborted. The threshold 308 may also be a floor level of the number of read, write, or erase, per unit time. This floor level may detect NVRAM devices with an abundance of defective flash pages. For erase operations, the threshold 308 also may be a floor level. Because of flash memory media geometry, I/O operations such as erase may end up becoming faster in the weakened or degraded region. If the duration for erase operation falls under the floor level, an error report may be generated. The threshold 308 may also be a threshold ratio of cells that hold data inconsistent with what was stored. Once the monitored ratio reaches the threshold ratio, an error report may be triggered. The threshold 308 also may be a threshold number of the occurrences of correctable errors as witnessed by master control 220. If the number of correctable errors seen by the master controller 220 exceeds the threshold value, an error report may be generated.

The threshold 308 may be adapted and adjusted on the fly at run time and during field operations. In addition, the threshold 308 may be stricter during the early life-time of a NVRAM device and may be relaxed towards the later stages of the life-time of the NVRAM device. As discussed above, during earlier stage of the life-time of the NVRAM device, fewer wear-induced anomalies are expected while in later stages of the life-time of the NVRAM device, more anomalies are expected due to wear and use over time. A life-term phase may refer to a period during the usable life-time of a NVRAM-device. An adjustable threshold may strike a balance in the trade-off between the number of alerts generated (which may slow down regular performance) and the amount of information obtained from monitoring.

In some implementations, the threshold 308 may be dynamically configured according to any machine learning scheme or generic algorithms that can improve on its own. The machine learning scheme or generic algorithm can learn from past patterns of I/O performance metrics to infer an optimal threshold value to best differentiate a normal region from a weakened or degraded region. Thus, adjustments of the threshold value may be made accordingly based on the inference. In other implementations, the thresholds may be programmed beforehand in a pre-determined manner. The pre-determined threshold value may be based on a statistical analysis, such as, for example, a student t-test, an ANOVA analysis, etc. The statistical analysis may consider the correlation of historical I/O performance metric and actual device status to derive the threshold value that optimally differentiates a normal group and a weakened/degraded group. The optimality of the differentiation may be based on the highest confidence level statically, the lowest p-value, etc.

In still other implementations, the threshold 308 may be adjusted retroactively based on a statistical analysis of current error reports from monitoring a given performance metric. In these implementations, a history of recorded performance metrics may be available on the master controller 220 on host computing device 100. The history data of a given performance metric may indicate a trend towards, for example, increased latency in a memory operation. The history data may reveal both long term and short term trends. Short term trends may be based on error data measurements collected over a period of hours or days while long term trends may refer to analysis based on measurements collected over longer time periods such as weeks or months. The trend may be analyzed based on a linear prediction (LP) model. In addition, the statistical analysis may reveal outliers from a distribution of recorded performance metrics. The cut-off threshold may be expressed as a statistical bar. For example, for a performance metric based on memory access speed, the statistical bar could be at 2-sigma above the mean access speed. For a normal distribution, a statistic bar at 2-sigma singles out approximately 5% of samples as outliers at the margins.

Table 1 below summarizes example threshold values of I/O performance metrics to trigger an error report in some implementations.

TABLE 1

Example threshold values of I/O metrics to trigger error report

| PE cycle range | Min Correctable Error Threshold (per 512B) | Max Correctable Error Threshold (per 512B) | # of 512B blocks in erase block showing correctable errors above min threshold | Write Time Threshold | Erase Time Threshold |
|---|---|---|---|---|---|
| 0-2000 | 1 | 3 | 4/2048 | 1.5 ms | 2.0 ms |
| 2000-3500 | 3 | 5 | 4/2048 | 1.5 ms | 2.0 ms |
| 3500-5000 | 5 | 10 | 8/2048 | 1.5 ms | 2.0 ms |
| 5000-7500 | 8 | 15 | 32/2048 | 2.0 ms | 3.0 ms |
| 7500-10000 | 12 | 20 | 128/2048 | 2.2 ms | 3.0 ms |
| 10000-20000 | 18 | 30 | 256/2048 | 2.5 ms | 3.0 ms |

The thresholds in Table 1 are established based on the wear level of an average flash cell, as measured by the current Program/Erase (P/E) cycle that the flash cell is on. For context, each erase operation increments the P/E cycle count for that erase block. For a flash memory cell currently at 2500 P/E cycle, which is covered by the second row in Table 1, the min and max threshold of correctable errors (per 512 B) are tabulated at 3 and 5, the threshold number of 512

B blocks in each erase block showing correctable error above the min threshold is tabulated at 4, the threshold write time is tabulated at 1.5 ms, and the threshold erase time is tabulated at 2.0 ms. As discussed above, these threshold values tend to become more relaxed when NVRAM-based storage subsystem becomes more aged (i.e., when the P/E cycle of the underlying flash memory cell has increased).

As discussed above, if a threshold (308) is exceeded or unmet, error report may be generated based on the error date (310). The reported error data from all constituent NVRAM devices may be analyzed (312). In some implementations, the error reports may be analyzed at various flash region granularities in association with the memory access operations being monitored. For example, the error report may be analyzed at the granularity of each write page and a write page may be 2 k-16 k bytes. The error report may also be analyzed on the basis of each erase block that includes a multitude of write pages. In this mode, each write page may not be analyzed individually but will be analyzed in the aggregate. The error report may additionally be analyzed at the plane level, with each plane including multiple erase blocks. In this mode, the erase blocks will be only be analyzed in the aggregate. The error report may further be analyzed at the die level in which the underlying planes will be analyzed in the aggregate rather than individually. The error report may further be analyzed at the granularity of each package in which the multiple underlying dice are analyzed in the aggregate. Likewise, the error report may be analyzed at the level of each card, which is the coarsest level of analysis.

The granularity of the analysis may be a function of the age of the NVRAM device. Earlier on in their expected life time, the granularity can be coarser as the I/O operations are expected to run smoothly then. Later on in the life time of the NVRAM device, the granularity may be finer due to an increased likelihood of glitches in the I/O operations. The granularity of analysis may hinge on the specific application utilizing the NVRAM device. For applications in which data integrity and reliability may be a paramount concern, such as remote and distributed database applications demanding atomic operations for data coherence across distributed data storage locations, the granularity of analysis may be finer. For applications in which data throughput may be favored over data integrity, such as, for example, routine data back-up for an e-commerce data server, the granularity may be coarser.

In some implementations, information in the error reports may be projected across various granularities. For example, if the information in an error report reveals good write pages existing within erase blocks that had experienced degraded write pages, then the good write pages may be considered as degraded write pages in an imputed manner. Similarly, if the information in an error report reveals good erase blocks in a plane level that includes bad erase blocks previously logged, then the good erase blocks may be considered as bad erase blocks in an imputed manner. Likewise, if the information in an error report reveals good die planes in a that has logged bad planes, the good planes may be considered as bad planes in an imputed manner out of an abundance of caution. Moreover, if the information in an error report reveals good dice in a package that has logged an earlier bad die, the good dice may be considered as bad dice in an imputed manner and out of an abundance of caution. Lastly, if the information in an error report reveals good packages in a card that has logged an earlier bad package, the good packages may be considered as bad packages in an imputed manner and out of an abundance of caution. The imputed approach may be favored for applications demanding high reliability data storage. Such data storage applications can be found in banking industry, electronic trading platform, defense industry (for example, controlling radar/sonar and missile launches, aerospace industry (for example, on-board control on space shuttles, satellites, and space stations), energy industry (for example, real-time control of centrifuges and reactors in a nuclear energy plant).

Status information of physical devices (314) may be generated when the error reports have been analyzed. As discussed above, the I/O access performance metrics may be collected at various times during the life cycle of a NVRAM device. When the I/O performance metrics have been measured, error reports may be triggered, which may then be analyzed (312). During earlier stages, status information of physical devices (314) may be generated less frequently when the expected anomalies are relatively rare. During later stages, status information of physical devices (314) may be generated more frequently when the expected anomalies are more likely.

Figure 4:
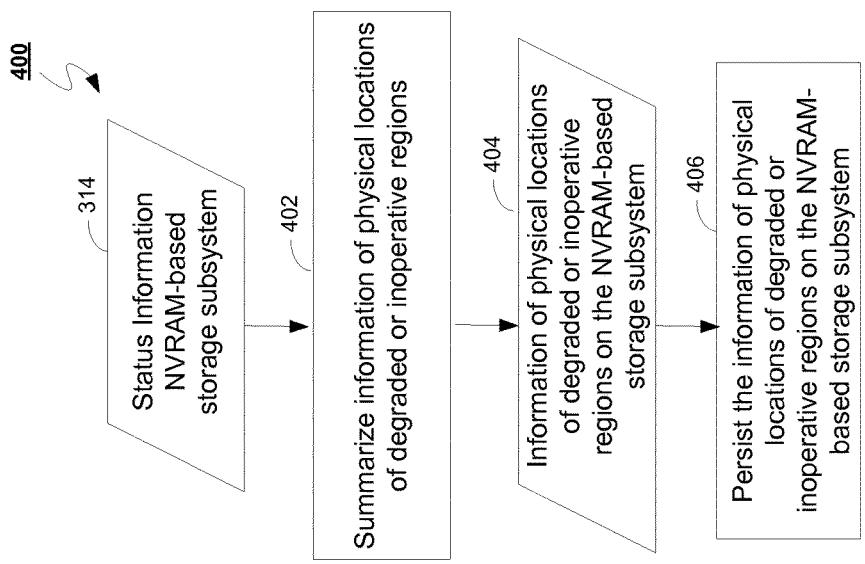
FIG. 4 is a flow chart of a method for mapping defective physical regions on an NVRAM according to some implementations.

FIG. 4 shows a flow chart of mapping defective physical regions on an NVRAM device according to some implementations. Generally, the information generated may be used to map weak regions of the NVRAM storage. In some implementations, the weak regions may correspond to weaker areas within an underlying flash memory media. Weaker or degraded areas within an underlying flash memory media generally refer to the areas that are more prone to an error report. For example, weaker or degraded areas may be more likely to receive a report of write page error than other areas of the underlying flash memory media when the threshold level for error reporting remains uniform throughout the underlying device. For example, the weaker or degraded areas within an underlying flash memory media may correspond to regions that have received disproportionately more error reports than other regions. For example, the weaker or degraded areas of the underlying flash memory media may have a more lenient threshold than other regions. In other implementations, the weak or degraded regions may also correspond to an entire flash memory media device. For example, weaker flash memory media may be more likely to receive an error of write page error than other NVMDs when the threshold levels for error reporting are identical throughout. For example, the weaker flash memory media may correspond to those NVMDs that have received disproportionately more error reports than other devices. For example, the weaker flash memory media may have a more lenient threshold level than other NVMDs. The identification of weaker areas within an underlying flash memory media or a weaker flash memory media may render the entire card in a degraded state.

When weakness or degradation of the NVRAM device has been mapped, subsequent I/O operations to the mapped weak regions may be reduced. Generally, the weaker or degraded areas are the areas that have bad I/O performance characteristics which may or may not be bad enough to cause the areas to be inoperative. The weaker or degraded areas may not correspond to just the nearest neighbors of the inoperative regions. As a general rule of thumb, however, as the NVRAM devices ages, the I/O performance metrics may be tracked more often and weaker regions are likely to deteriorate from weaker regions to inoperative regions.

Referring to Table 1, for correctable error counts, flash regions that show more than the "max correctable error threshold" may be labeled as "inoperative". flash regions exhibiting error count properties larger than "min" and less than "max" may be labeled as "degraded"—and as an example, subject to lower read disturb thresholds. For write time thresholds, a constant factor (e.g., 1.5 or similar numbers) may be used in some implementations to differentiate degraded and inoperative regions. For example, with a write duration threshold of 2.0 ms, flash regions seeing program times of less than 2 ms may be considered normal, flash regions seeing program times above 2.0 ms but less than 3.0 ms may be considered degraded, and flash regions seeing program times above 3.0 ms considered inoperative.

Once the physical locations of the weakened or degraded regions are mapped on each NVRAM device of a NVRAM-based storage subsystem, an application on host computing device needs to be made aware of these physical locations. Initially, physical locations of degraded or inoperative regions on each constituent NVRAM devices may be summarized for the NVRAM-based storage subsystem (402). For example, the storage may be on a special portion within the NVRAM, such as a Single-Level-Cell (SLC) portion to facilitate or improve I/O operation performance. As discussed above, SLC portions may provide faster memory access than MLC portions at the expense of smaller capacity per unit cost. Thereafter, the summarized information of the physical locations (404) may be persisted (406), for example, at a central server.

Based on this summarized information, FTL 141 may avoid these bad blacks when mapping physical locations on the NVRAM storage subsystem to logical block address (LBA). The LBA is the block device view presented to the operating system for mapping to a logic block in the file system, as seen by an application.

The stored information may reveal a system-level representation of the bad blocks for the entire NVRAM-based storage subsystem.

The system-level representation of bad blocks on NVRAM devices on the NVRAM-based storage subsystem may be utilized in a variety of ways for device management. The status information may be used to characterize pre-manufacturing defects as a feedback to the processor of the underlying semiconductor components on, for example, yield, defect distribution, device durability, etc. The system-level representation of bad blocks may also be used as feedback to product manufacturing. The feedback may provide information on reliability of the NVRAM devices as manufactured. The system-level representation of bad blocks may additionally guide deployment of the NVRAM devices in an enterprise computing environment as an NVRAM-based storage subsystem. The deployment may provide a central reporting capability for the slave controllers to submit error reports to a central location, for example, through master controller 220.

Based on the system-level implementation, fewer I/O operations may be scheduled in the mapped weaker or degraded areas as summarized in the system level representation. Based on the summarized representation of weaker or degraded areas, various memory access scheduling may be performed. At the page level, for example write operations in the mapped weaker or degraded areas may be disabled and only read operations may be allowed in the mapped weaker areas. For example, read operations in some weaker or degraded areas may be stopped when the correctable error associated with the weaker or degraded areas surpasses threshold levels in a consistent manner. For example, read operations in some weaker or degraded areas may be stopped when the aggregated read errors in these weaker areas exceed a critical ceiling number. These read operations may be resumed after the corresponding information in the weaker or degraded areas is relocated to other flash regions.

At the block level, for example, I/O operations may be scheduled to shift from using both fast and slow pages to only using fast pages. In some implementations, fast pages may have an associated I/O latency on the order of 400 µs while the slow pages may generally have an associated I/O latency of less than about 2 ms.

The particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular configurations of the system have been described. Other configurations may be used. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method for managing a non-volatile random-access memory (NVRAM)-based storage subsystem, the method comprising:
    monitoring, by a slave controller on a NVRAM device of the NVRAM-based storage subsystem, input/output (I/O) operations on the NVRAM device;
    measuring, by the slave controller on the NVRAM device, a duration of completing a particular I/O operation on the NVRAM device, and then comparing measured duration of the particular I/O operation to a time-out value indicating an upper limit for the I/O operation on the NVRAM device beyond which the I/O operation on the NVRAM will be aborted;
    responsive to determining that the measured duration of the particular I/O operation exceeds the time-out value, measuring, by the slave controller on the NVRAM device, a performance characteristic associated with I/O operation on the NVRAM device, wherein the performance characteristic is different from the duration of the particular I/O operation;
    comparing, by the slave controller on the NVRAM device, the measured performance characteristic to a threshold setting;
    reporting, by the slave controller on the NVRAM device and to a master controller of the NVRAM-based storage subsystem, information based on results of the comparison of the measured performance characteristic to the threshold setting; and
    determining, by the master controller of the NVRAM-based storage system and based on reported information, a physical location of a defect region on the NVRAM device where the performance characteristic was measured.

2. The method of claim 1, further comprising:
    summarizing information encoding physical locations of defect regions on multiple NVRAM devices of the NVRAM-based storage subsystem; and
    storing the summarized information for persistent storage.

3. The method of claim 2, further comprising:
driving decisions managing subsequent I/O operations on the multiple NVRAM devices of the NVRAM-based storage subsystem in view of the summarized information stored.

4. The method of claim 1, wherein monitoring the I/O operations on the NVRAM device comprises monitoring at least one of: a read operation on the NVRAM device, a write operation on the NVRAM device, and an erase operation on the NVRAM device.

5. The method of claim 1, wherein monitoring is performed more frequently during a first life-time phase of the NVRAM device than during a second life-time phase of the NVRAM device, wherein the first life-time phase is earlier than the second life-time phase.

6. The method of claim 1, wherein measuring the performance characteristic comprises measuring a duration of completing a particular I/O operation on the NVRAM device.

7. The method of claim 1, wherein measuring the performance characteristic comprises measuring a number of occurrences of correctable errors associated with the I/O operations on the NVRAM device, wherein the correctable error is curable by an error-checking mechanism.

8. The method of claim 1, wherein measuring the performance characteristic further comprises measuring an error rate associated with the I/O operations on the NVRAM device.

9. The method of claim 1, wherein measuring the performance characteristic of the NVRAM device further comprises measuring a number of occurrences of correctable errors associated with the I/O operations on the NVRAM device and wherein comparing the measured performance characteristic to the threshold setting comprises comparing the measured number of occurrences of correctable errors to the threshold setting.

10. The method of claim 1, wherein measuring a performance characteristic of the NVRAM device comprises measuring an error rate associated with the I/O operations on the NVRAM device and wherein comparing the measured performance characteristic to the threshold setting comprises the measured error rate to the threshold setting.

11. The method of claim 1, wherein the threshold setting relates to a statistical outlier, and wherein comparing the measured performance characteristic to the threshold setting comprises determining whether the measured performance characteristic qualifies as a statistical outlier.

12. The method of claim 11, wherein determining whether the measured performance characteristic qualifies as a statistical outlier comprises determining whether the measured performance characteristic is more than a pre-determined number of standard deviations away from a statistical mean of past instances of the measured performance characteristic.

13. The method of claim 1, further comprising: configuring the threshold setting.

14. The method of claim 1, wherein ascertaining the physical location of the defect region comprises ascertaining whether the defect region corresponds to one of: a degraded region, or an inoperative region.

15. A non-volatile random access memory (NVRAM)-based storage subsystem mounted on a host computing device, the NVRAM-based storage subsystem comprising:
a plurality of NVRAM devices, each comprising a plurality of packages and a slave controller, and each being configured to:
monitor (input/output) I/O operations on the NVRAM device;
measure a duration of completing a particular I/O operation on the NVRAM device and then compare the measured duration of the particular I/O operation to a time-out value indicating an upper limit for the I/O operation on the NVRAM device beyond which the I/O operation on the NVRAM will be aborted;
responsive to determining that the measured duration of the particular I/O operation exceeding the time-out value, measure, by the slave controller on the NVRAM device, a performance characteristic associated with I/O operation on the NVRAM device, wherein the performance characteristic is different from the duration of the particular I/O operation;
compare the measured performance characteristic to a threshold setting; and
report information based on results of the comparison of the measured performance characteristic to the threshold setting;
a master controller, in communication with at least one of the slave controllers and configured to determine a physical location of a defect region on the NVRAM device where the performance characteristic was measured,
wherein each package comprises multiple dice, and
wherein each die comprises multiple planes.

16. The NVRAM-based storage subsystem of claim 15, wherein each plane comprises at least one of: a Single-Level Cell (SLC) NAND flash, a Multi-Level Cell (MLC) NAND flash, a Single-Level Cell (SLC) NOR flash.

17. The NVRAM-based storage subsystem of claim 15, wherein the I/O operation on the NVRAM device comprises one of: a read operation on the NVRAM device, a write operation on the NVRAM device, and an erase operation on the NVRAM device.

18. The NVRAM-based storage subsystem of claim 15, wherein each slave controller is further configured to monitor the I/O operations more frequently during a first life-time phase of the NVRAM device than during a second life-time phase of the NVRAM device, wherein the first life-time phase is earlier than the second life-time phase.

19. The NVRAM-based storage subsystem of claim 15, wherein each slave controller is further configured to measure: a number of occurrences of a correctable error associated with the I/O operations on the NVRAM device, or an error rate associated with the I/O operations on the NVRAM device, and wherein the correctable error is curable by an error-checking mechanism.

20. The NVRAM-based storage subsystem of claim 19, wherein each slave controller is further configured to compare the measured number of occurrences of curable I/O errors to the threshold setting.

21. The NVRAM-based storage subsystem of claim 19, wherein each slave controller is further configured to compare the measured error rate to the threshold setting.

22. The NVRAM-based storage subsystem of claim 15, wherein the threshold setting relates to a statistical outlier, and wherein each slave controller is further configured to compare the measured performance characteristic to the threshold setting by determining whether the measured performance characteristic qualifies as a statistical outlier.

23. The NVRAM-based storage subsystem of claim 22, wherein each slave controller is further configured to determine whether the measured performance characteristic qualifies as an outlier by determining whether measured performance characteristic is more than a pre-determined number of standard deviations away from a statistical mean of past instances of the measured performance characteristic.

24. The NVRAM-based storage subsystem of claim 15, wherein each slave controller is further configured to adapt the threshold setting.

25. The NVRAM-based storage subsystem of claim 15, wherein the master controller is further configured to:
summarize information encoding physical locations of defect regions on multiple NVRAM devices; and
store the summarized information for persistent storage.

26. The NVRAM-based storage subsystem of claim 25, wherein the master controller is further configured to:
drive decisions managing subsequent I/O operations on the multiple NVRAM devices of the NVRAM-based storage subsystem in view of the summarized information stored.

27. The NVRAM-based storage subsystem of claim 15, wherein the master controller is further configured to:
report, to the host computing device, the measured performance characteristic after the threshold setting has been surpassed; and
when reporting, summarize the measured performance characteristics.

28. The NVRAM-based storage subsystem of claim 27, wherein the master controller is configured to:
cause the host computing device to upload the summarized information to a central server, wherein the central server is configured to use the summarized information to determine the threshold setting in subsequent manufacturing and deployment of NVRAM devices of the same type as the NVRAM devices of the NVRAM-based storage subsystem.

29. The NVRAM-based storage subsystem of claim 15, wherein the master controller is further configured to:
project the reported information from a flash plane in which the performance characteristic was measured to a die that includes the flash plane, or to a package that includes the die.

30. A non-volatile random access memory (NVRAM)-based storage subsystem mounted on a host computing device, the NVRAM-based storage subsystem comprising:
a plurality of NVRAM devices, each comprising a plurality of packages and a slave controller, and each being configured to:
monitor an I/O operation on the NVRAM device by measuring a duration of completing the I/O operation on the NVRAM device and then comparing the measured duration of the I/O operation to a time-out value indicating an upper limit for the I/O operation on the NVRAM device beyond which the I/O operation on the NVRAM will be aborted;
responsive to determining that the measured duration of the monitored I/O operation exceeding the time-out value; identify at least one occurrence of error data associated with the monitored I/O operation;
measure a numeric aspect of the occurrence of the at least one error data on the NVRAM device, wherein the occurrence of the at least one error data is different from the duration of the particular I/O operation;
compare a numeric aspect of the occurrence of the at least one error data with a threshold setting; and
report the at least one occurrence of error data in response to the numeric aspect crossing the threshold setting;
a master controller means, in communication with at least one of the slave controllers, for determining a physical location of a defect on the NVRAM corresponding to the at least one error occurrence by analyzing the reported at least one error, wherein each package comprises multiple dice, and wherein each die comprises multiple planes.

* * * * *